United States Patent
Cases et al.

(10) Patent No.: US 7,725,783 B2
(45) Date of Patent: May 25, 2010

(54) METHOD AND APPARATUS FOR REPEATABLE DRIVE STRENGTH ASSESSMENTS OF HIGH SPEED MEMORY DIMMS

(75) Inventors: Moises Cases, Austin, TX (US); Daniel N. de Araujo, Cedar Park, TX (US); Bradley D. Herrman, Cary, NC (US); Erdem Matoglu, Austin, TX (US); Bhyrav M. Mutnury, Austin, TX (US); Pravin Patel, Cary, NC (US); Nam H. Pham, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 11/780,505

(22) Filed: Jul. 20, 2007

(65) Prior Publication Data
US 2009/0021264 A1 Jan. 22, 2009

(51) Int. Cl.
*G11C 29/00* (2006.01)

(52) U.S. Cl. .............. 714/718; 714/5; 714/25; 714/42; 714/43; 714/56; 714/704; 714/712; 365/201; 702/38

(58) Field of Classification Search .......... None
See application file for complete search history.

(56) References Cited

U.S. PATENT DOCUMENTS

| | | | | |
|---|---|---|---|---|
| 3,889,053 A | * | 6/1975 | Lloyd et al. ........... | 348/129 |
| 4,053,833 A | * | 10/1977 | Malmberg et al. ...... | 324/752 |
| 4,605,893 A | * | 8/1986 | Braslau ................ | 324/642 |
| 4,704,576 A | * | 11/1987 | Tributsch et al. ...... | 324/751 |
| 4,996,659 A | * | 2/1991 | Yamaguchi et al. ..... | 714/736 |
| 5,417,494 A | * | 5/1995 | Kempa et al. ......... | 374/5 |
| 5,852,617 A | | 12/1998 | Mote, Jr. | |
| 6,178,526 B1 | | 1/2001 | Nguyen et al. | |
| 6,882,161 B2 | | 4/2005 | Kim et al. | |
| 2002/0032537 A1 | | 3/2002 | Hunter | |
| 2002/0073370 A1 | * | 6/2002 | Akram ................ | 714/724 |
| 2002/0183955 A1 | | 12/2002 | Adler | |
| 2004/0145935 A1 | | 7/2004 | Jakobs | |
| 2005/0168234 A1 | * | 8/2005 | Kwark ............... | 324/765 |
| 2006/0049823 A1 | * | 3/2006 | Suzuki .............. | 324/202 |
| 2006/0239055 A1 | | 10/2006 | Sonoda et al. | |
| 2007/0091814 A1 | * | 4/2007 | Leung et al. ......... | 370/252 |

* cited by examiner

*Primary Examiner*—John P Trimmings
(74) *Attorney, Agent, or Firm*—Cynthia Seal; Hoffman Warnick LLC

(57) ABSTRACT

The present invention assesses memory (DIMM) strength by calculating frequency content of a radiated field which is collected by an apparatus, such as a dipole antenna. Radiated field is created by accelerated charge, which is a function of the slew rate or DIMM strength. Radiated power is directly proportional to the frequency at which bits are driven. By separating the radiated field from the near field or stored field, the DIMM strength content is isolated from other functional DIMM issues, such as tRCD latency, refresh cycles, addressing mode, etc. By examining the radiated power, the disadvantages of the prior art, such as by probing the DIMM's contacts, are avoided.

22 Claims, 3 Drawing Sheets

METHOD AND APPARATUS FOR REPEATABLE DRIVE STRENGTH ASSESSMENTS OF HIGH SPEED MEMORY DIMMS

FIELD OF THE INVENTION

The present invention relates generally to high speed DIMMs and, more specifically, to an apparatus for repeatable drive strength assessments of high speed memory devices, such as DIMMs.

BACKGROUND OF THE INVENTION

To assess the driver strength of DIMMs in high performance high speed server systems, in prior art systems, there is a need to probe at the chip pad interface while the device is in operation. A DIMM, or a Dual In-line Memory Module, is one popular type of memory module. The DIMM is a rectangular low-profile circuit board that has electrical contact points arranged on both sides along one long edge. The contact points form electrical connections to the main board's memory bus when the DIMM is inserted into a DIMM memory socket. Today, there is the ability to measure at the pin of the chip or memory controller to assess the drive strength. (A memory controller is a chip on a computer's motherboard or CPU die which manages the flow of data going to and from the memory.) The disadvantage in using this kind of approach is that the trace itself produces unwanted stub loading into the probe and signal under test. (Stub loading on the main bus can be caused by excessively long stubs and/or stubs terminated in low impedances and can load down the main bus and result in transmission line reflections, and therefore waveform distortions.) This can have the effect of increasing the bit error rate for terminals receiving data on the bus, or in extreme circumstances, cause terminals to stop receiving completely. Another disadvantage is the uncertainty in being able to repeat the measurement consistently.

Multiple time probing can result in damaging the BGA pins. (A ball grid array (BGA) is a type of surface-mount packaging used for integrated circuits.) Use of sophisticated probe stations is one way to over come this limitation, but probe stations that provide this kind of measurement capability are expensive and cost 100s of thousands of dollars.

There is currently a need for inexpensive test jig for assessing DIMM strength. (A jig is an adapter for connecting electronic devices to a service and maintenance system for testing, debugging and firmware update purposes.)

BRIEF SUMMARY OF THE INVENTION

The present invention is an apparatus for repeatable drive strength assessments of high speed memory DIMMs.

The present invention assesses memory (DIMM) strength by calculating frequency content of a radiated field which is collected by an apparatus, such as a dipole antenna. Radiated field is created by accelerated charge, which is a function of the slew rate or DIMM strength. Radiated power is directly proportional to the frequency at which bits are driven. By separating the radiated field from the near field or stored field, the DIMM strength content is isolated from other functional DIMM issues, such as tRCD latency, refresh cycles, addressing mode, etc. (tRCD latency (RAS to CAS Delay) is the number of clock cycles needed between a row address strobe (RAS) and a column address strobe (CAS). It is the time required between the computer defining the row and column of the given memory block and the actual read or write to that location. tRDC stands for Row address to Column address Delay.) By examining the radiated power, the disadvantages of the prior art, such as by probing the DIMM's contacts, are avoided.

The illustrative aspects of the present invention are designed to solve one or more of the problems herein described and/or one or more other problems not discussed.

BRIEF DESCRIPTION OF THE SEVERAL VIEWS OF THE DRAWINGS

These and other features of the invention will be more readily understood from the following detailed description of the various aspects of the invention taken in conjunction with the accompanying drawings that depict various embodiments of the invention, in which.

The drawings are intended to depict only typical aspects of the invention, and therefore should not be considered as limiting the scope of the invention. In the drawings, like numbering represent like elements between the drawings.

DETAILED DESCRIPTION OF THE PREFERRED EMBODIMENT OF THE PRESENT INVENTION

The present invention provides an apparatus for repeatable drive strength assessments of high speed memory units, such as DIMMs.

Figure 1:
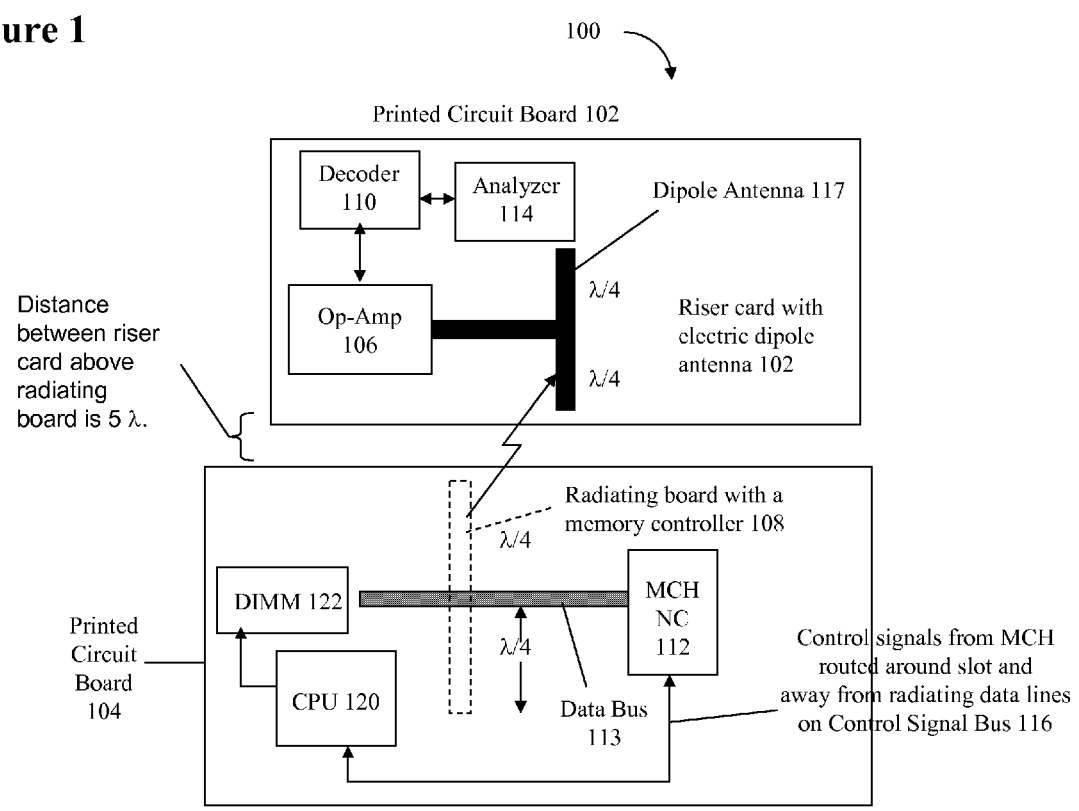
FIG. 1 depicts the system of the present invention.

FIG. 1 depicts the Memory System Configuration 100 of the present invention. A DIMM 122 (a DIMM, or dual in-line memory module, comprises a series of random access memory integrated circuits. These modules are mounted on a printed circuit board and designed for use in personal computers) communicates via Data Bus 113 with MCH 112. (An MCH, or memory controller hub, is traditionally one of the two chips in the core logic chipset on a PC motherboard, the other being the southbridge.) The basis of the present invention is to assess DIMM strength by calculating frequency content of a radiated field. Radiated field is created by accelerated charge, which is a function of the slew rate or DIMM strength. Radiated power is directly proportional to the frequency at which bits are driven. By separating the radiated field from the near field or stored field, the DIMM strength content is isolated from other functional DIMM issues, such as TRCD latency, refresh cycles, addressing mode, etc.

Figure 3:
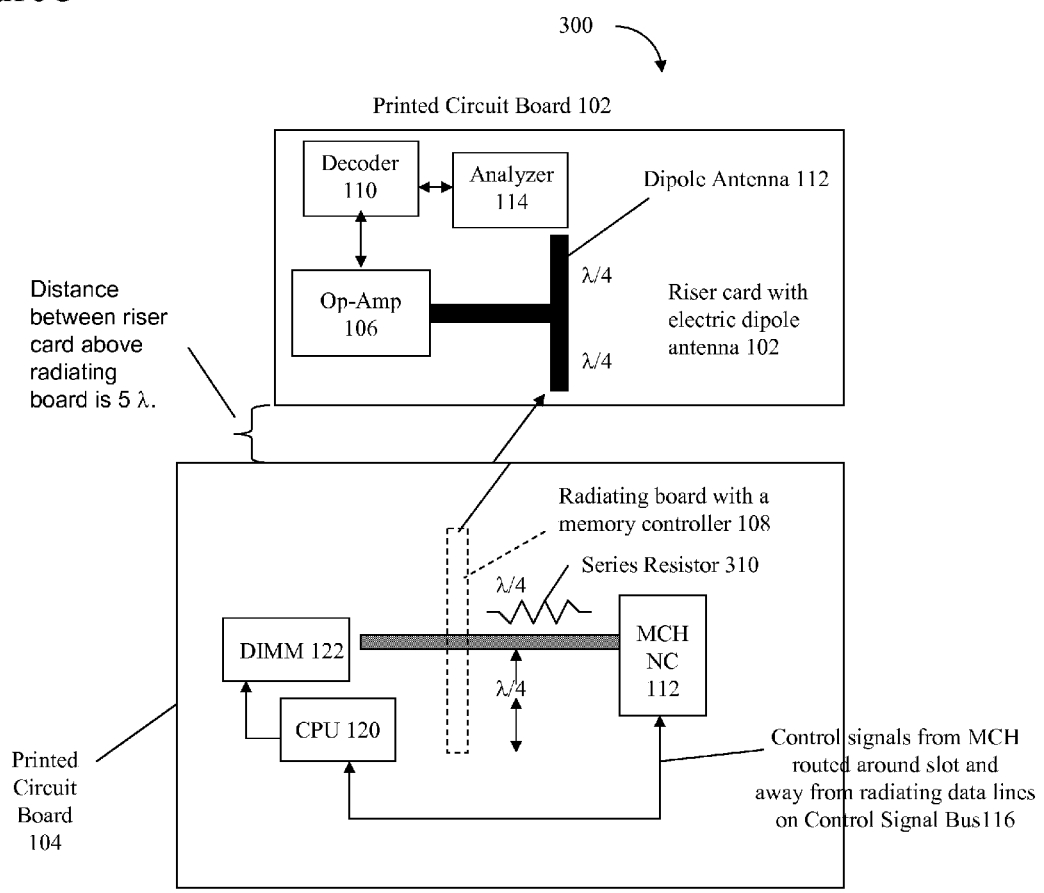
FIG. 3 represents the system of the present invention having a dampening resistor.

The apparatus of the preferred embodiment has two printed circuit boards, Printed Circuit Board 102 and Printed Circuit Board 104. One board (Printed Circuit Board 102) is configured to radiate utilizing Riser with Dipole Antenna 117 from operational amplifier (Op-Amp 106) for amplifying the data received from Printed Circuit Board 104. An Op-Amp is a DC-coupled high-gain electronic voltage amplifier with differential inputs and, usually, a single output. In its ordinary usage, the output of the op-amp is controlled by negative feedback which, because of the amplifier's high gain, almost completely determines the output voltage for any given input. A dipole antenna is an antenna with a center-fed driven element for transmitting or receiving radio frequency energy. These antennas are the simplest practical antennas from a theoretical point of view. The Dipole Antenna 117 receives data from the other (Printed Circuit Board 104) which transmits data from Radiating Board 108 based on the concept of reciprocity and the Op-Amp 106 amplifies the data that has been transmitted by Radiating Board 108 and the data is decoded by Decoder 110. The data is then passed to Analyzer 114 which analyzes the data received by the Di-Pole Antenna 117 to determine the strength of the tested DIMMs (such as DIMM 122). On the Radiating Board 108, is a memory controller. The memory controller exercises the DIMM during testing. During testing, the memory controller exercises the DIMM (such as DIMM 122) in read mode, so only the DIMM is driving, and in burst mode, so that an alternating current is created. The test results are radiated by Radiating Board 108 and received by Di-Pole Antenna 117, amplified by Op-Amp 106 and decoded by Decoder 110. Only the memory data lines are radiated in that the control signals are routed around Radiating Board 108 on Control Signal Bus 116. The memory data traces (Data Bus 113) can be routed across open slots in the shield layer that are half a wavelength (lambda $\lambda$) long. Each memory controller output buffer is over damped with a series resistor which can be seen in FIG. 3. The objective of the present invention is to not confuse the switching strength of the memory DIMM's output buffer with memory controller's output buffer. The two output buffers share the same data bus trace 113. One bidirectional buffer is inside the memory controller (Memory Controller Hub 112. The other is inside the memory DIMM 122. In the apparatus of the present invention, the memory controller's output buffer switching strength is attenuated with an external series resistor that is located in close proximity to the memory controller. This is shown in FIG. 3 as series resistor 310. The combined memory controller's output buffer and series resistor 310 act as one slow degraded driver. The memory device output buffer is not influenced by the series resistor and operates full strength and at maximum slew rate.

The present invention allows the system to generate a continuous flow of data out of the memory device and onto the memory data traces (Data Bus 113). In the apparatus of the present invention, the memory controller stores, in the memory DIMM, the data pattern with the highest repetitive pattern and sets up the read operation. The test begins with the memory controller requesting memory data with read commands. The read commands are transferred from the memory controller to the memory device. The read commands configure the memory device to output memory data patterns that are stored in memory.

After the read command operation, the memory control stops transmitting and converts to receive mode. The memory DIMM (122) takes over the data bus, responds with its output driver switching at maximum frequency and exports the requested data pattern as a continuous stream of bits in burst mode. Memory DIMMs output buffer produces alternating cyclic patterns on the data trace 113. Thus, spectral frequency associated with the radiation pattern detected is predominately produced by the memory DIMM's output buffer.

As noted above, the board is configured so the DIMM's data outs are fast switching buffers. A like card 102 has an electric antenna whose half wavelength (lambda $\lambda$) matches the DIMM burst mode frequency. The card is positioned like a riser card next to and into the radiating card. The signal radiated is received and amplified with the Op-Amp 106. The received signal is translated into a frequency spectrum display. From the frequency spectrum display, the fundamental frequency magnitude is compared to a reference magnitude. By inspecting the fundamental frequency magnitude against the reference magnitude, the drive strength of the high speed memory device, such as DIMM 122, may be assessed.

Figure 2:
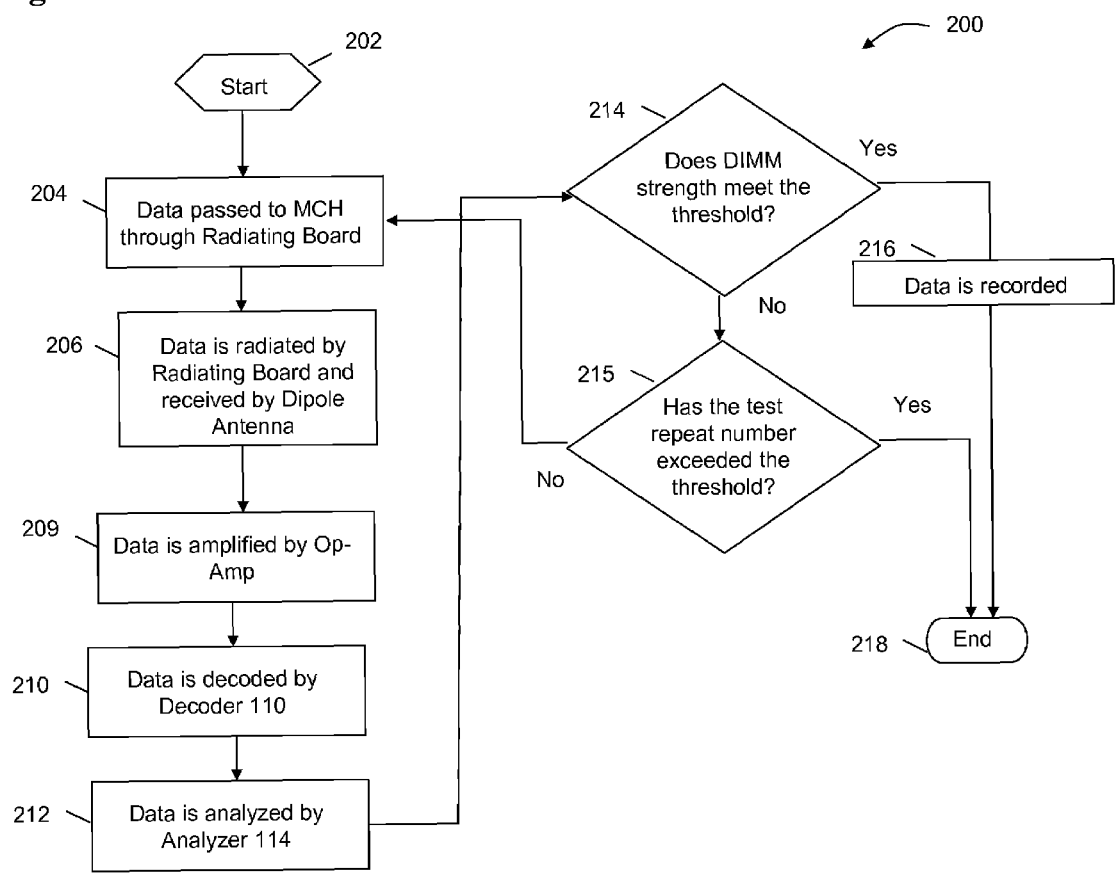
FIG. 2 represents the method of the present invention.

FIG. 2 depicts the Method 200 of the present invention. It starts at Step 202 and continues to Step 204 where data is passed from the memory (DIMM 122 in the preferred embodiment) to a memory control hub (MCH 112 in the preferred embodiment) through a radiating board (Radiating Board 108). At Step 206, the data is radiated from Radiating Board 108 and is received by Di-Pole Antenna 117. As was noted previously, the Radiating Board 108 further has a Memory Controller which exercises the memory (DIMM 122) in read mode, so only the DIMM is driving, and in burst mode, so that an alternating current is created. This allows Analyzer 114 to analyze the data received to determine memory (DIMM in this case) strength. At step 209, the received signals are amplified by Op-Amp 106. The received signals are generally of low power level so that they need to be amplified. At Step 210, the received signals are decoded by the Decoder 110 and, at Step 212, the decoded signals are analyzed by Analyzer 114. At Step 214, the Analyzer 212 determines whether the DIMM strength meets the threshold and, if so, the data is recorded at Step 216 and process ends at Step 218. If not, at Step 215, it is determined how many times the test has been repeated (tests may need to be repeated in the case there was a mis-measure or other misfires) and if the test repeat has not met the threshold, the test is repeated and goes to Step 204. If the test repeat number has been reached, the process ends at 218.

FIG. 3 depicts the System 300 of the present invention illustrating the dampening resistor 310.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. An apparatus for repeatable drive strength assessments of high speed memory devices, such as dual inline memory modules (DIMMs), the apparatus comprising:
    a. at least two printed circuit boards, one of the boards is configured to radiate, the other board is configured to receive and decode the radiation, the radiating board further has a memory controller wherein, during the drive strength assessment, the memory controller exercises a memory device in read mode, so only the memory device is driving, and in burst mode, so that an alternating current is created;
    b. at least one memory device, the at least one memory device having data outs which are fast switching buffers;
    c. memory data traces for carrying data to and from the memory controller and the at least one memory device wherein only the memory data traces are radiated by the radiating board and wherein the memory data traces are half a wavelength long;
    d. the memory controller having an output buffer; and
    e. each memory controller output buffer is over damped with a series resistor.

2. The apparatus of claim 1 wherein the other board has an electric antenna whose half wavelength matches the memory device burst mode frequency.

3. The apparatus of claim 2 wherein the other board is positioned like a riser board next to and into the radiating board.

4. The apparatus of claim 3 wherein the signal radiated from the radiating board is received and amplified with an op amp.

5. The apparatus of claim 4 wherein the received signal is translated into a frequency spectrum display showing a fundamental frequency magnitude.

6. The apparatus of claim 5 wherein the fundamental frequency magnitude is compared to a reference magnitude.

7. The apparatus of claim 2 wherein the antenna is a dipole antenna.

8. The apparatus of claim 1 wherein a driver slew rate is measured.

9. A method for testing a high speed memory device, such as a DIMM, for its drive strength, the method comprising the steps of:
   a. exercising the memory device to be tested by requiring the memory device to pass data;
   b. radiating the passed data;
   c. receiving the radiated data;
   d. analyzing the received radiated data; and
   e. storing the analyzed data.

10. The method of claim 9 wherein Step d further comprises analyzing a slew rate of the radiated data.

11. The method of claim 9 wherein Step c further comprises the step of amplifying the received radiated data.

12. The method of claim 11 wherein Step c further comprises the step of decoding the received radiated data.

13. The method of claim 12 wherein Step c further comprises the step of analyzing the received radiated data.

14. The method of claim 13 wherein the analyzing the received radiated data step further comprises the step of determining whether a memory strength meets a threshold.

15. The method of claim 14 wherein Step c further comprises the step of determining whether a predetermined number of re-tests has occurred and, if not, going to Step a.

16. A computer software program comprising program code stored on a computer-readable medium, which when executed, enables a computer system to implement a method for drive strength assessments of high speed memory devices, such as DIMMs, in a system comprising a central processing unit (CPU), the method comprising the steps of:
   a. exercising a memory device to be tested by requiring the memory device to pass data;
   b. radiating the passed data;
   c. receiving radiated data;
   d. analyzing the received radiated data; and
   e. storing the analyzed data.

17. The computer software program of claim 16 wherein the method having step d further comprises analyzing a slew rate of the radiated data.

18. The computer software program of claim 16 wherein the method having step c further comprises the step of amplifying the passed data.

19. The computer software program of claim 18 wherein the method having step c further comprises the step of decoding the received radiated data.

20. The computer software program of claim 18 wherein step c further comprises the step of analyzing the received radiated data.

21. The computer software program of claim 20 wherein, in the method, the analyzing the received radiated data step further comprises the step of determining whether a memory strength meets a threshold.

22. The computer software program of claim 21 wherein the method step of step c further comprises the step of determining whether a predetermined number of re-tests has occurred and, if not, going to step a.

* * * * *